(12) United States Patent
Lu

(10) Patent No.: US 11,271,312 B2
(45) Date of Patent: Mar. 8, 2022

(54) SEMICONDUCTOR DEVICE PACKAGE AND METHOD FOR MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 6 days.

(21) Appl. No.: 16/575,123

(22) Filed: Sep. 18, 2019

(65) Prior Publication Data

US 2021/0083388 A1    Mar. 18, 2021

(51) Int. Cl.
| | |
|---|---|
| *H01Q 9/04* | (2006.01) |
| *H01L 23/538* | (2006.01) |
| *H01L 23/66* | (2006.01) |
| *H01L 23/00* | (2006.01) |
| *H01L 21/683* | (2006.01) |
| *H01L 21/48* | (2006.01) |
| *H01L 21/56* | (2006.01) |
| *H01L 23/31* | (2006.01) |

(52) U.S. Cl.
CPC ....... *H01Q 9/0414* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/3128* (2013.01); *H01L 23/5383* (2013.01); *H01L 23/5386* (2013.01); *H01L 23/5389* (2013.01); *H01L 23/66* (2013.01); *H01L 24/19* (2013.01); *H01L 24/20* (2013.01); *H01L 2221/68372* (2013.01); *H01L 2223/6677* (2013.01); *H01L 2224/214* (2013.01)

(58) Field of Classification Search
CPC ..... H01Q 9/0414; H01Q 1/2233; H01Q 5/385
See application file for complete search history.

(56) References Cited

U.S. PATENT DOCUMENTS

| | | | | |
|---|---|---|---|---|
| 5,307,075 | A * | 4/1994 | Huynh | .............. H01Q 9/0414 |
| | | | | 343/700 MS |
| 6,118,406 | A * | 9/2000 | Josypenko | .............. H01Q 1/38 |
| | | | | 343/700 MS |
| 7,474,268 | B2 | 1/2009 | Cheng et al. | |
| 2019/0051609 | A1* | 2/2019 | Hsu | .............. H01L 23/5383 |

(Continued)

*Primary Examiner* — Dameon E Levi
*Assistant Examiner* — Jennifer F Hu
(74) *Attorney, Agent, or Firm* — Foley & Lardner LLP

(57) ABSTRACT

A semiconductor device package includes a circuit layer and a first antenna structure. The circuit layer includes a first surface, and a second surface opposite to the first surface. The first antenna structure is disposed on the first surface and electrically connected to the circuit layer. The first antenna structure includes a first patch, a second patch, a third patch, a first dielectric layer and a second dielectric layer. The second patch is disposed on the first patch. The first dielectric layer has a first dielectric constant (Dk), and is disposed between the first patch and the second patch. The third patch is disposed on the second patch. The second dielectric layer has a second dielectric constant and is disposed between the second patch and the third patch. The first dielectric constant is smaller than the second dielectric constant.

6 Claims, 18 Drawing Sheets

(56) References Cited

U.S. PATENT DOCUMENTS

| | | | | |
|---|---|---|---|---|
| 2020/0127387 A1* | 4/2020 | Park | ............... | H01Q 5/10 |
| 2020/0395675 A1* | 12/2020 | Han | ............... | H01Q 5/35 |
| 2021/0066814 A1* | 3/2021 | Kim | ............... | H01Q 9/0414 |
| 2021/0083389 A1* | 3/2021 | Tung | ............... | H01Q 1/38 |

* cited by examiner

SEMICONDUCTOR DEVICE PACKAGE AND METHOD FOR MANUFACTURING THE SAME

BACKGROUND

1. Technical Field

The present disclosure relates to a semiconductor device package and a method for manufacturing the same, and to a semiconductor device package using stacked patch antenna structure to achieve multi-directional wireless communication and a method for manufacturing the same.

2. Description of the Related Art 5G communication system may be implemented in very high frequency range (e.g., 30 GHz-300 GHz), and is adapted to achieve a high data transfer rate. High frequency signal transmission, however, is constrained due to its high directivity and high energy loss.

SUMMARY

In some embodiments, a semiconductor device package includes a circuit layer and a first antenna structure. The circuit layer includes a first surface, and a second surface opposite to the first surface. The first antenna structure is disposed on the first surface and electrically connected to the circuit layer. The first antenna structure includes a first patch, a second patch, a third patch, a first dielectric layer and a second dielectric layer. The second patch is disposed on the first patch. The first dielectric layer has a first dielectric constant (Dk), and is disposed between the first patch and the second patch. The third patch is disposed on the second patch. The second dielectric layer has a second dielectric constant and is disposed between the second patch and the third patch. The first dielectric constant is smaller than the second dielectric constant.

In some embodiments, a semiconductor device package includes a circuit layer and a substantially asymmetric antenna structure. The substantially asymmetric antenna structure is disposed on and electrically connected to the circuit layer. The substantially asymmetric antenna structure includes a step structure including a first patch, a second patch and a third patch stacked on one another, and edges of the first patch, the second patch and the third patch are misaligned.

In some embodiments, a method of manufacturing a semiconductor device package is provided. A circuit layer is formed. An antenna structure is formed on the circuit layer. The antenna structure includes a plurality of patches stacked on one another. The patches are different in lengths, and any two adjacent patches are separated by a dielectric layer.

BRIEF DESCRIPTION OF THE DRAWINGS

Aspects of some embodiments of the present disclosure are readily understood from the following detailed description when read with the accompanying figures. Various structures may not be drawn to scale, and the dimensions of the various structures may be arbitrarily increased or reduced for clarity of discussion.

DETAILED DESCRIPTION

Figure 1:
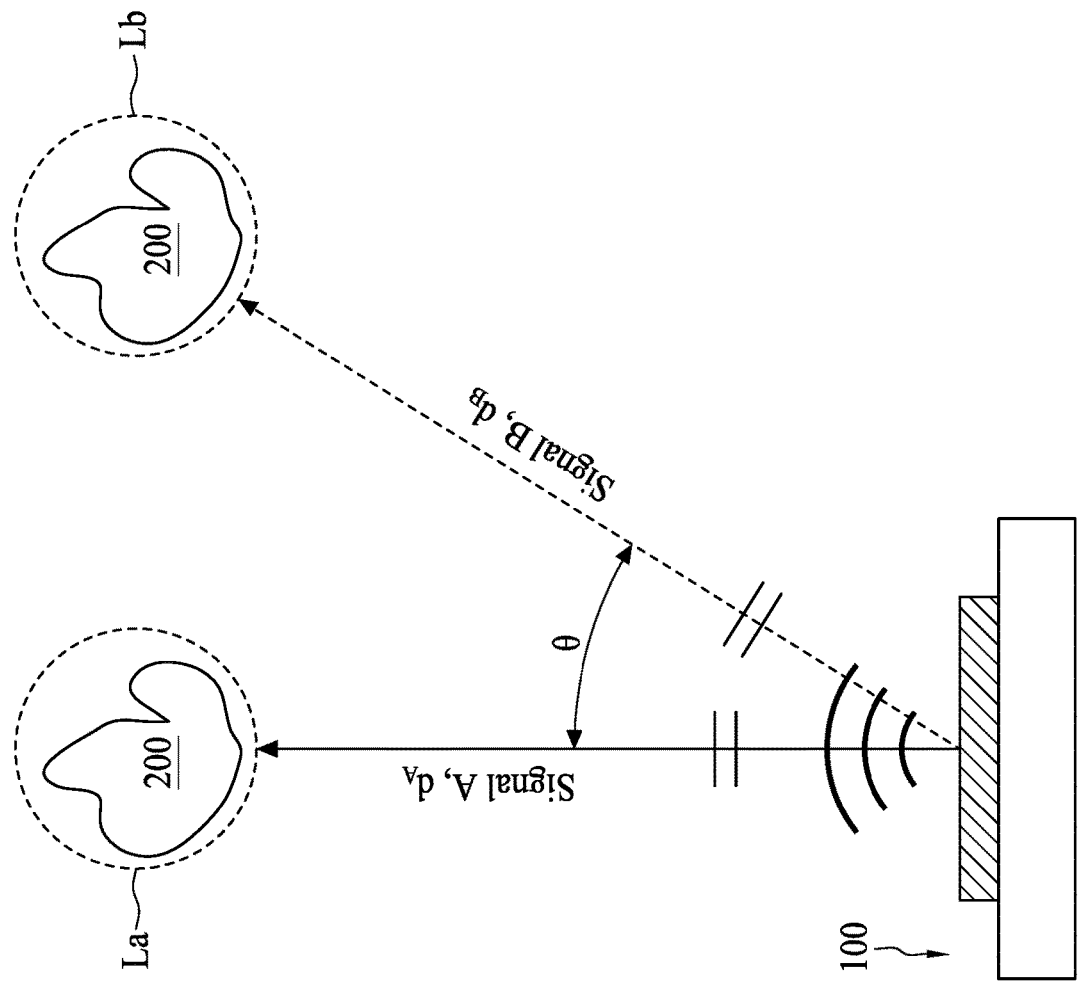
FIG. 1 is a cross-sectional view of a flat patch antenna in accordance with some embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

In some embodiments, the present disclosure provides a semiconductor device package and a method for manufacturing the same. The semiconductor device package includes a stacked patch antenna to increase signal intensity and coverage in normal direction and non-normal direction. The stacked patch antenna includes multiple patches and multiple dielectric layers interposed between the patches. The lengths of the patches vary in a gradient manner, and the dielectric constants of the dielectric layers are selected to match the lengths of the patches such that the multiple patches of the stacked patch antenna may be responsive to signals of the same frequency in normal direction and non-normal direction.

FIG. 1 is a cross-sectional view of a flat patch antenna 100 in accordance with some embodiments of the present disclosure. As shown in FIG. 1, the distance dB between a flat patch antenna 100 and the object 200 at a location Lb in an oblique direction of the flat patch antenna 100 is larger than the distance $d_A$ between the flat patch antenna 100 and the object 200 at a location La in a normal direction of the flat patch antenna 100, and thus the signal B at location Lb is weaker than the signal A at location La. The signal loss in the oblique direction increases when the included angle θ between the normal direction and the oblique direction increases, and thus the flat patch antenna 100 is highly directive.

Figure 2:
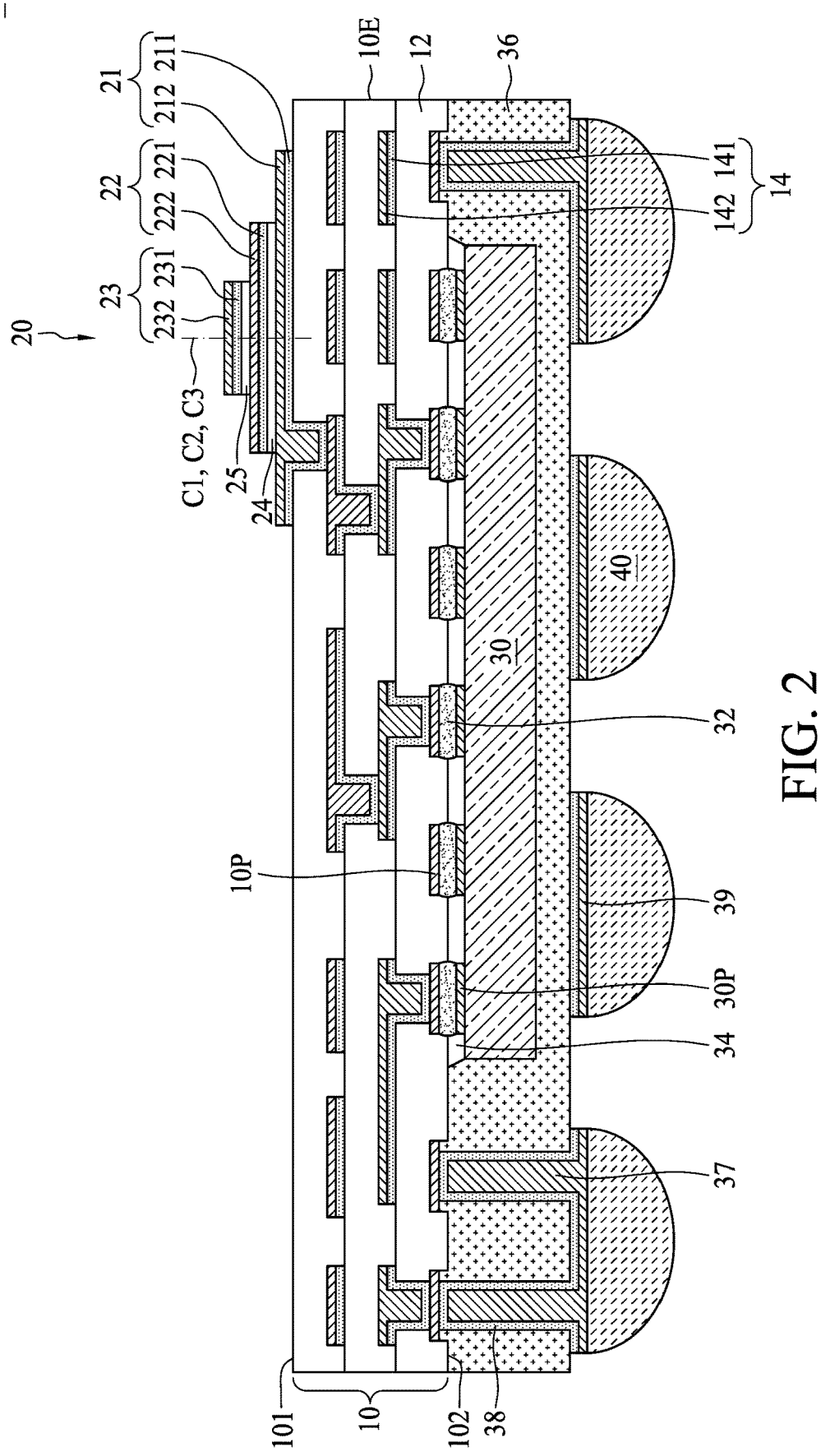
FIG. 2 is a cross-sectional view of a semiconductor device package in accordance with some embodiments of the present disclosure.
Figure 2A:
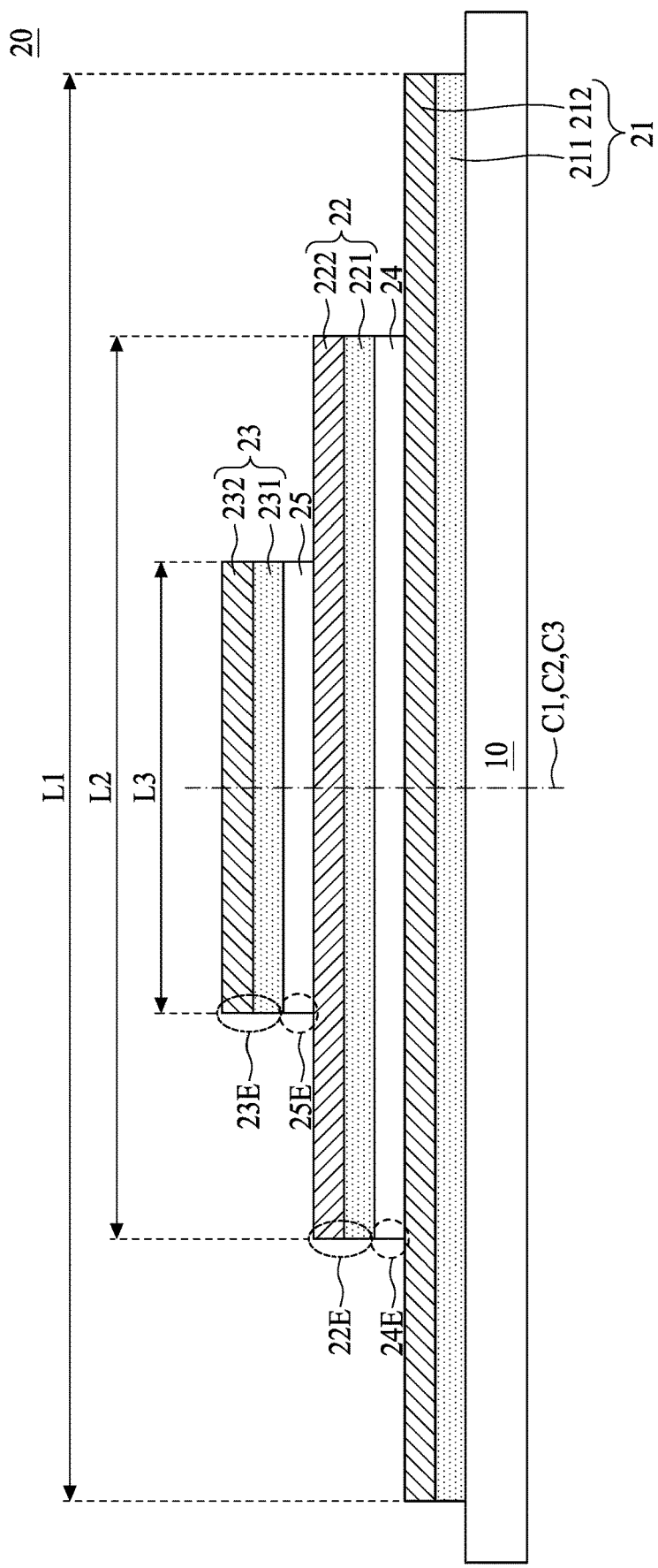
FIG. 2A is an enlarged cross-sectional view of a first antenna structure in FIG. 2 in accordance with some embodiments of the present disclosure.

FIG. 2 is a cross-sectional view of a semiconductor device package 1 in accordance with some embodiments of the present disclosure, and FIG. 2A is an enlarged cross-sectional view of a first antenna structure 20 in FIG. 2 in accordance with some embodiments of the present disclosure. As shown in FIG. 2 and FIG. 2A, the semiconductor device package 1 includes a circuit layer 10 and a first antenna structure 20. The circuit layer 10 includes a first surface 101, and a second surface 102 opposite to the first surface 101. In some embodiments, the circuit layer 10 may include a redistribution layer (RDL). By way of example, the circuit layer 10 may include one or more dielectric layers 12 and one or more conductive layers 14 stacked on one another. Examples of the dielectric layers 12 may individually include organic dielectric material such as polyimide (PI), epoxy, FR4 glass fiber, inorganic dielectric material such as silicon oxide, silicon nitride, ceramic, glass, sapphire, or a combination thereof. The conductive layer 14 may include a multi-layered conductive layer. For example, the conductive layer 14 may include a seed layer 141, and a conductive wiring layer 142 disposed on the seed layer 141. Examples of the material of the seed layer 141 may include metal such as nickel (Ni), titanium (Ti), tungsten (W) or an alloy thereof. Examples of the material of the conductive wiring layer 142 may include metal such as gold (Au), silver (Ag), copper (Cu), aluminum (Al), platinum (Pt), palladium (Pd) or an alloy thereof.

The first antenna structure 20 is disposed on the first surface 101 of the circuit layer 10, and electrically connected to the circuit layer 10. The first antenna structure 20 may include multiple patches, and dielectric layers stacked on one another. In some embodiments, the first antenna structure 20 may include a first patch 21, a second patch 22, a third patch 23, a first dielectric layer 24 and a second dielectric layer 25. The second patch 22 is disposed on the first patch 21. The first dielectric layer 24 has a first dielectric constant (Dk) and is disposed between the first patch 21 and the second patch 22. The third patch 23 is disposed on the second patch 22. The second dielectric layer 25 has a second dielectric constant and disposed between the second patch 22 and the third patch 23. The first patch 21, the second patch 22 and the third patch 23 may include conductive material. The first dielectric layer 24 and the second dielectric layer 25 may include dielectric or insulating material, and the first dielectric constant and the second dielectric constant are different. For example, the first dielectric constant is smaller than the second dielectric constant.

In some embodiments, an edge 24E of the first dielectric layer 24 is substantially aligned with an edge 22E of the second patch 22, and an edge 25E of the second dielectric layer 25 is substantially aligned with an edge 23E of the third patch 23. In some embodiments, the first patch 21, the second patch 22 and the third patch 23 each may include a stack of conductive films. The bottom conductive film may be configured as a seed layer and/or an adhesion layer, and the top conductive film may be grown on the seed layer and/or adhered to the adhesion layer. By way of example, the first patch 21 may include a stack of a first conductive film 211 and a second conductive film 212. The second patch 22 may include a stack of a first conductive film 221 and a second conductive film 222. The third patch 23 may include a stack of a first conductive film 231 and a second conductive film 232.

Examples of the first dielectric layer 24 and the second dielectric layer 25 may individually include organic dielectric material such as polyimide (PI), epoxy, FR4 glass fiber, inorganic dielectric material such as silicon oxide, silicon nitride, ceramic, glass, sapphire, or a combination thereof. Examples of the material of the first conductive films 211, 221, 231 each may include metal such as nickel (Ni), titanium (Ti), tungsten (W) or an alloy thereof. Examples of the material of the second conductive films 212, 222, 232 each may include metal such as gold (Au), silver (Ag), copper (Cu), aluminum (Al), platinum (Pt), palladium (Pd) or an alloy thereof.

In some embodiments, the first antenna structure 20 is disposed adjacent to an edge 10E of the circuit layer 10. There may be multiple first antenna structures 20 disposed at different locations of the circuit layer 10 to increase coverage of the communication range of the semiconductor device package 1.

The semiconductor device package 1 may further include a semiconductor die 30 electrically connected to the circuit layer 10. In some embodiments, the semiconductor die 30 may be disposed on the second surface 102 of the circuit layer 10. The semiconductor die 30 may be electrically connected to the circuit layer 10 through conductive structures 32. In some embodiments, the conductive structures 32 may include solder material such as solder bumps, solder ball or the like. The conductive structures 32 may be electrically connected to the semiconductor die 30 with bonding pads 30P such as under bump metallurgies (UBMs) of the semiconductor die 30, and electrically connected to the circuit layer 10 with bonding pads 10P such as UBMs of the semiconductor die 30. In some embodiments, the conductive structures 32 may include conductive pillar such as copper pillars, copper studs or the like. An underfill 34 may be disposed between the semiconductor die 30 and the circuit layer 10. In some embodiments, an encapsulation layer 36 may be disposed on the second surface 102 of the circuit layer 10, and encapsulating the semiconductor die 30. In some embodiments, conductive vias 37 such as conductive pillars may penetrate through the encapsulation layer 36 and electrically connect the circuit layer 10. Seed layers 38 may be disposed between the conductive vias 37 and the circuit layer 10. Bonding pads 39 may be disposed on the encapsulation layer 36, and electrical conductors such as solder balls 40 may be disposed on the bonding pads 39.

The first patch 21 has a first length L1, the second patch 22 has a second length L2, the third patch 23 has a third length L3, and the first length L1, the second length L2 and the third length L3 are different. In some embodiments, the first length L1, the second length L2 and the third length L3 are decreasingly arranged, e.g., the second length L2 is smaller than the first length L1, and the third length L3 is smaller than the second length L2. In some embodiments, the first antenna structure 20 includes a substantially symmetric antenna structure. The imaginary central line C2 of the second patch 22 is substantially aligned with the imaginary central line C1 of the first patch 21, and the imaginary central line C3 of the third patch 23 is substantially aligned with the imaginary central line C2 of the second patch 22.

The first patch 21, the second patch 22 and the third patch 23 of the first antenna structure 20 are configured for transceiving signals with the same frequency band. In some embodiments, the first dielectric constant of the first dielectric layer 24 and the second dielectric constant of the second dielectric layer 25 are different and determined by the lengths of the first patch 21, the second patch 22 and the third patch 23 such that the first patch 21, the second patch 22 and the third patch 23 of the first antenna structure are responsive to the same frequency band. For example, as the second length L2 is smaller than the first length L1 and the third length L3 is smaller than the second length L2, the first dielectric constant of the first dielectric layer 24 is set to be smaller than the second dielectric constant of the second dielectric layer 25. As such, the first patch 21, the second patch 22 and the third patch 23 of the first antenna structure 20 can transmit and receive signals with the same frequency band.

Figure 2B:
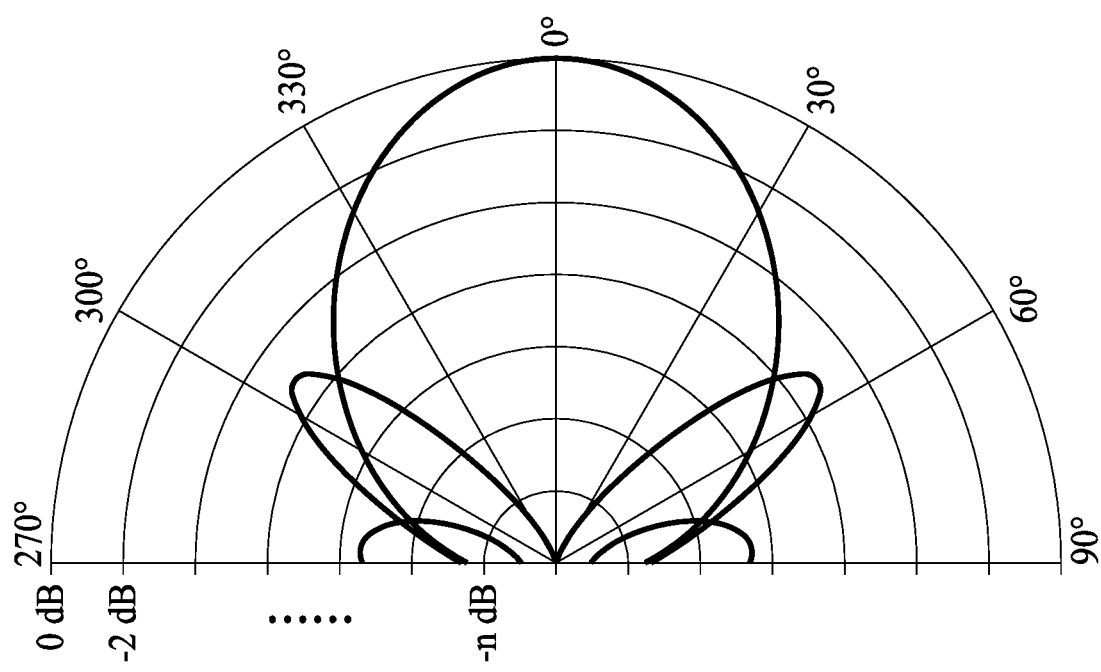
FIG. 2B is a polar radiation plot of a semiconductor device package in accordance with some embodiments of the present disclosure.

FIG. 2B is a polar radiation plot of a semiconductor device package in accordance with some embodiments of the present disclosure. The polar radiation plot shows that the first antenna structure 20 includes a main lobe with the highest antenna gain in the normal direction, and several side lobes with considerably high antenna gain in other oblique directions. Thus, the first antenna structure 20 including a stack of the first patch 21, the second patch 22 and the third patch 23 with decreasing lengths can be responsive to the signals in a direction normal to the first antenna structure 20 and also to the signals in directions oblique to the first antenna structure 20. Accordingly, the first antenna structure 20 can implement multi-directional communication.

The semiconductor device packages and manufacturing methods of the present disclosure are not limited to the above-described embodiments, and may be implemented according to other embodiments. To streamline the description and for the convenience of comparison between various embodiments of the present disclosure, similar components the following embodiments are marked with same numerals, and may not be redundantly described.

Figure 3:
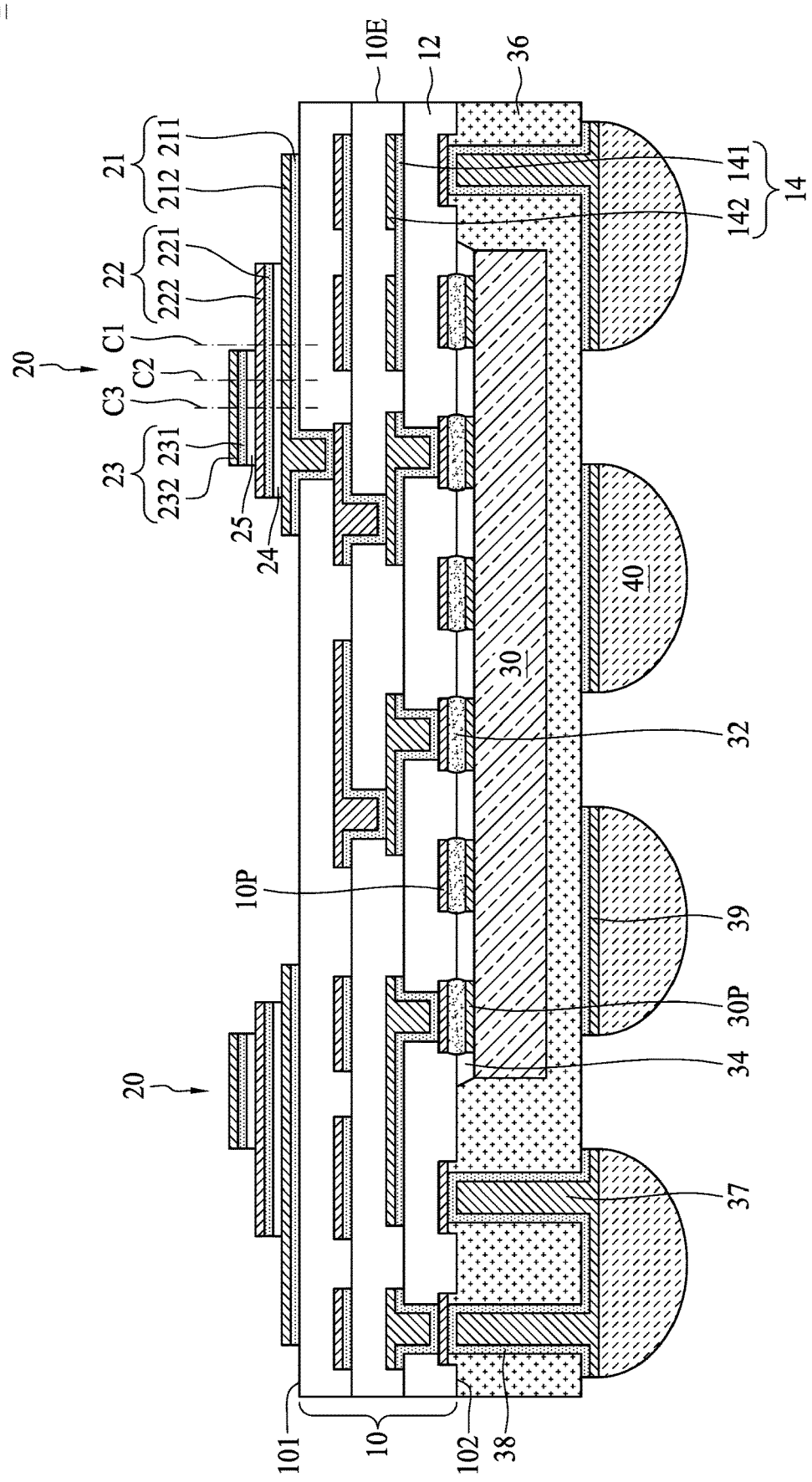
FIG. 3 is a cross-sectional view of a semiconductor device package in accordance with some embodiments of the present disclosure.
Figure 3A:
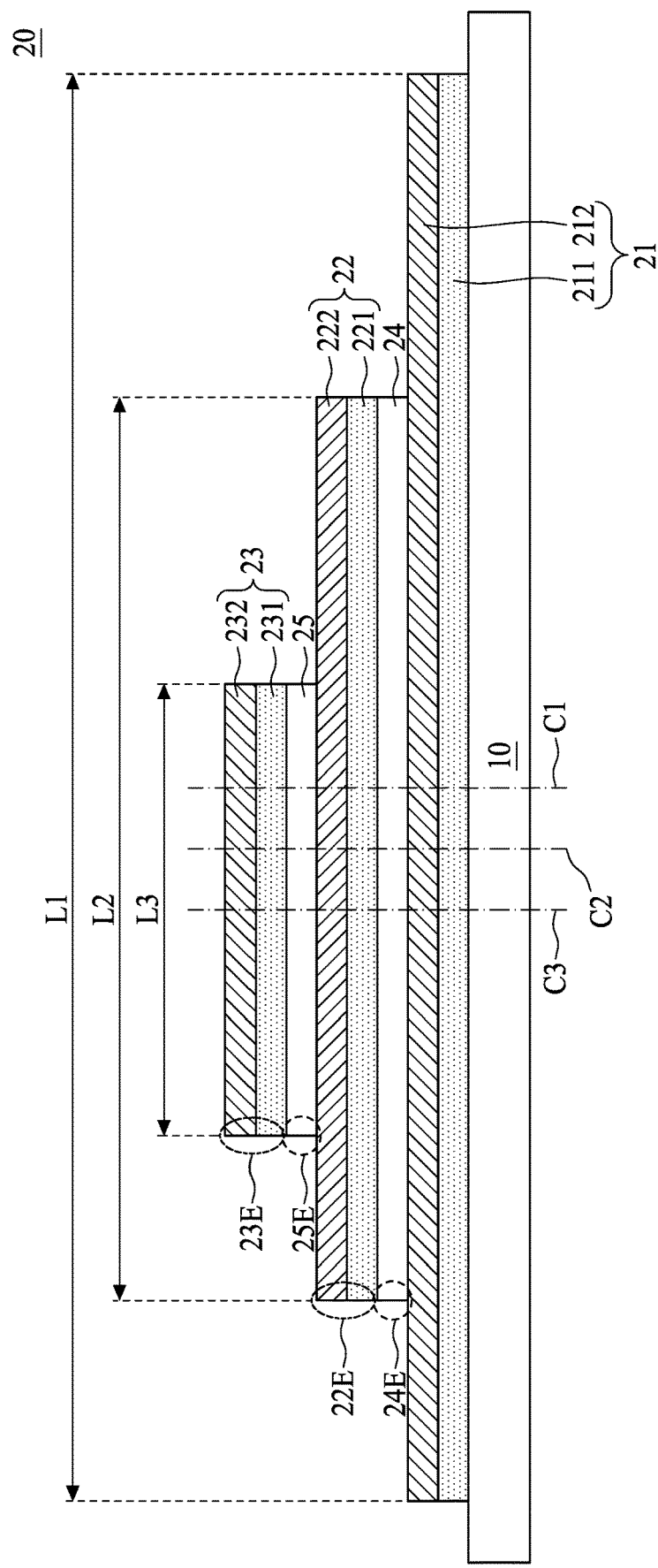
FIG. 3A is an enlarged cross-sectional view of a first antenna structure in FIG. 3 in accordance with some embodiments of the present disclosure.

FIG. 3 is a cross-sectional view of a semiconductor device package 2 in accordance with some embodiments of the present disclosure, and FIG. 3A is an enlarged cross-sectional view of a first antenna structure 20 in FIG. 3 in accordance with some embodiments of the present disclosure. As shown in FIG. 3 and FIG. 3A, the semiconductor device package 1, the first antenna structure 20 of the semiconductor device package 2 includes one or more substantially asymmetric antenna structures. The imaginary central line C2 of the second patch 22 is misaligned with the imaginary central line C1 of the first patch, and the imaginary central line C3 of the third patch 23 is misaligned with the imaginary central line C2 of the second patch 22. In some embodiments, the overlying patch of the substantially asymmetric antenna structure is shifted with respect to the underlying patch from the edge 10E toward the center of the circuit layer 10. The step structure formed by the first patch 21, the second patch 22 and the third patch 23 can help shorten the equivalent distance between the first antenna structure 20 and the transmitting end or receiving end of an object in an oblique direction, and thus signal intensity and coverage of the first antenna structure 20 can be enhanced in oblique directions.

Figure 4:
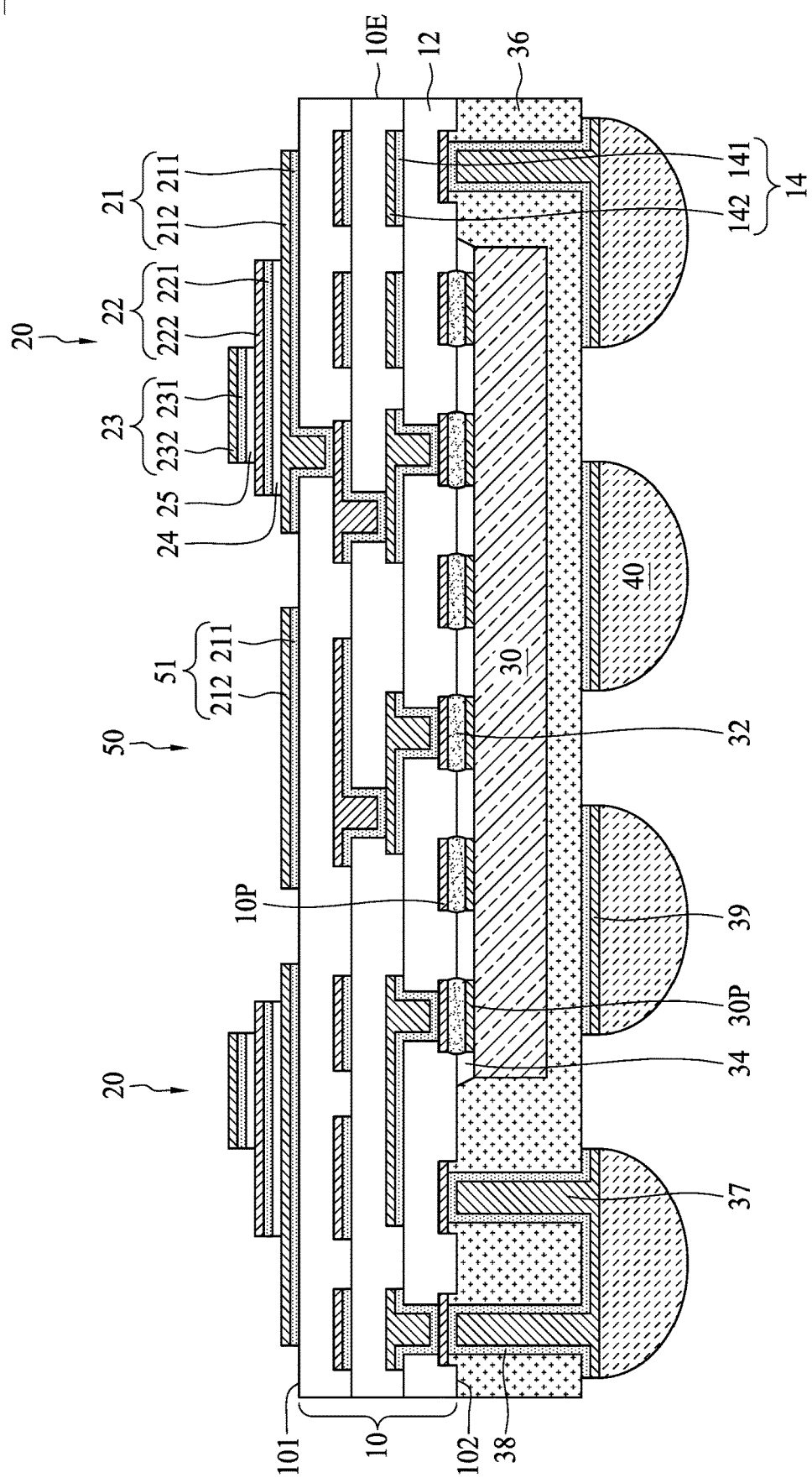
FIG. 4 is a cross-sectional view of a semiconductor device package in accordance with some embodiments of the present disclosure.
Figure 4A:
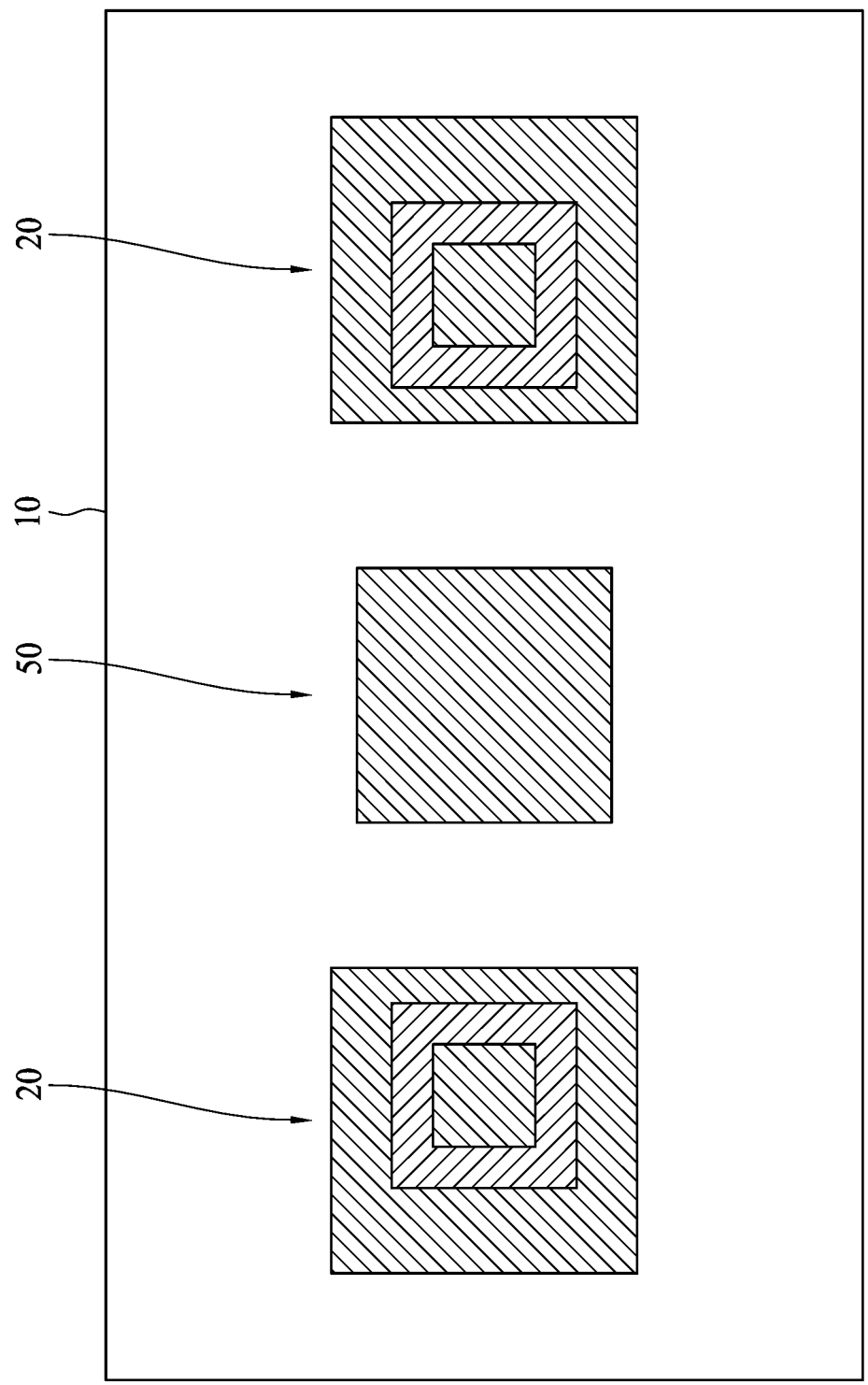
FIG. 4A is a top view of a f semiconductor device package in accordance with some embodiments of the present disclosure.

FIG. 4 is a cross-sectional view of a semiconductor device package 3 in accordance with some embodiments of the present disclosure, and FIG. 4A is a top view of a f semiconductor device package 3 in accordance with some embodiments of the present disclosure. As shown in FIG. 4 and FIG. 4A, in contrast to the semiconductor device package 2 in FIG. 3, the semiconductor device package 3 includes one or more first antenna structures 20, and one or more second antenna structures 50. The first antenna structure 20 may include a substantially asymmetric antenna structure as illustrated in FIG. 3. The second antenna structure 50 may include a substantially symmetric antenna structure adjacent to the substantially asymmetric antenna structure. In some embodiments, the substantially symmetric antenna structure may include a fourth patch 51. The fourth patch 51 may include a stack of a first conductive film 211 and a second conductive film 212. The first antenna structure 20 may be configured to enhance signal intensity or coverage in oblique directions, and the second antenna structure 50 may be configured to enhance signal intensity or coverage in normal direction. The second antenna structure 50 may be disposed on, adjacent to or at least partially embedded in the first surface 101 of the circuit layer 10.

Figure 5A:
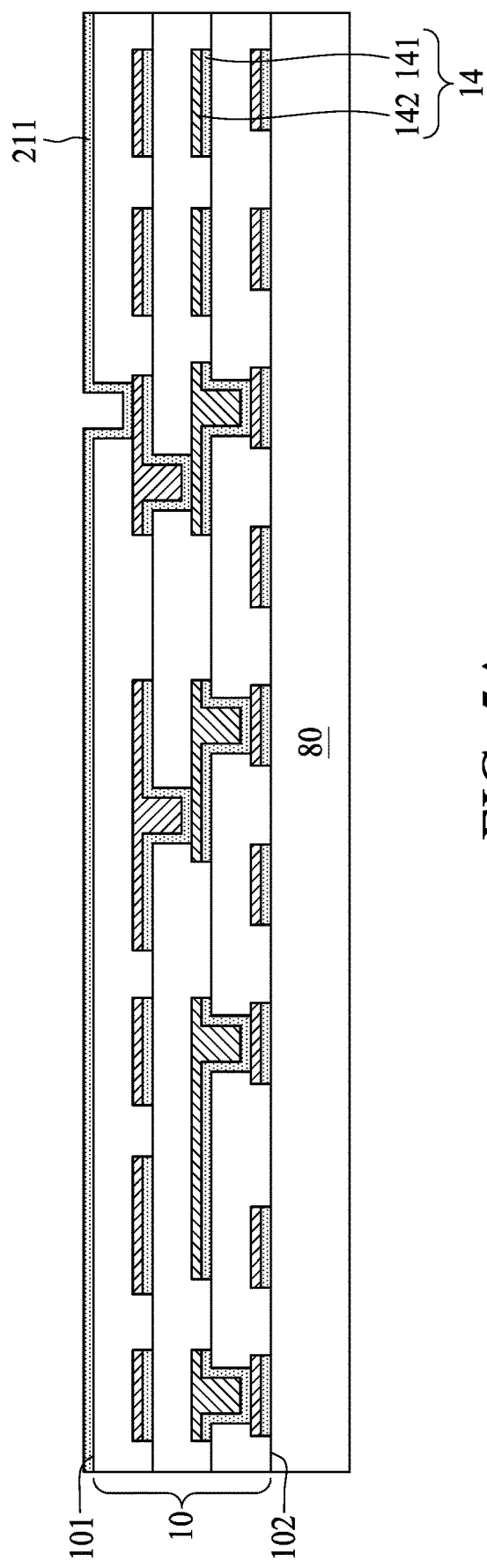
FIG. 5A, FIG. 5B, FIG. 5C, FIG. 5D, FIG. 5E, FIG. 5F and FIG. 5G illustrate operations of manufacturing a semiconductor device package in accordance with some embodiments of the present disclosure.

FIG. 5A, FIG. 5B, FIG. 5C, FIG. 5D, FIG. 5E, FIG. 5F and FIG. 5G illustrate operations of manufacturing a semiconductor device package in accordance with some embodiments of the present disclosure. As shown in FIG. 5A, a circuit layer 10 is formed. A first conductive film 211 configured as a seed layer is formed on the first surface 101 of the circuit layer 10. The circuit layer 10 may be formed on a carrier 80. In some embodiments, the circuit layer 10 may include a bumping-level circuit layer or a substrate-level circuit layer. By way of example, the L/S of the circuit layer 10 may be between about 2 μm/about 2 μm and about 10 μm/about 10 μm or wider than about 10 μm/about 10 μm. The bumping-level circuit layer may be patterned and defined by e.g., photolithography-plating-etching techniques, or by e.g., laser drill-plating-etching techniques.

Figure 5B:
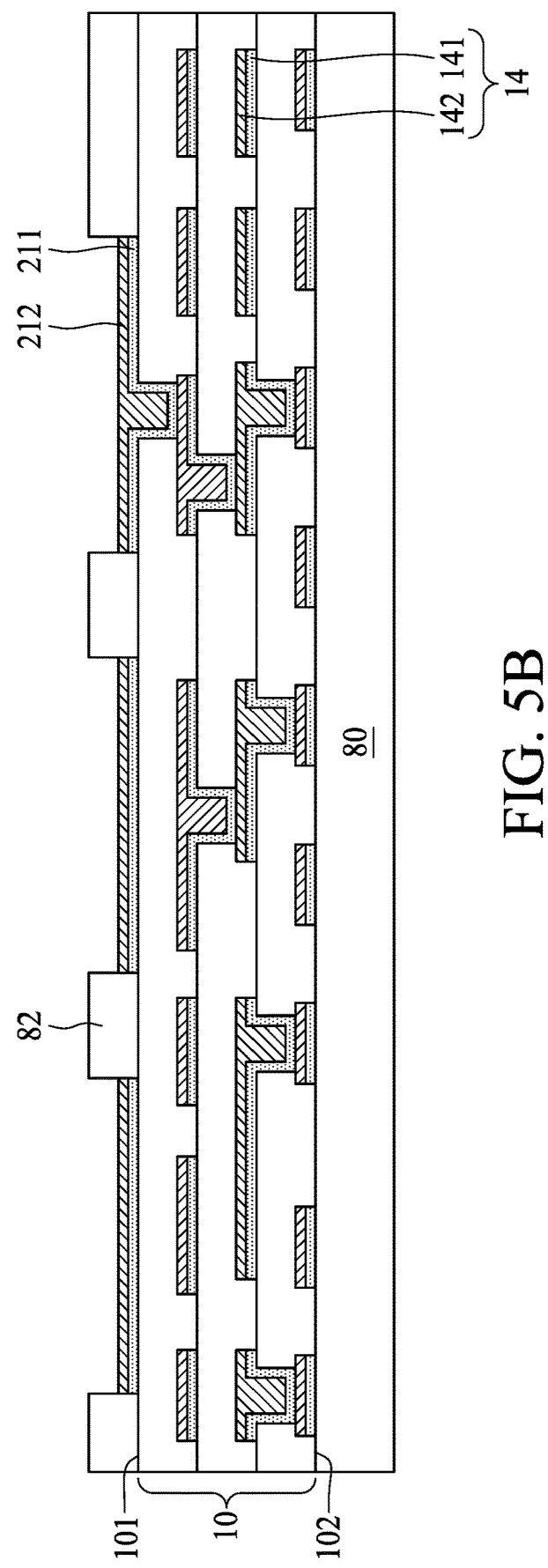

As shown in FIG. 5B, a second conductive film 212 is formed on the first conductive film 211. In some embodiments, a masking pattern 82 such as a photoresist pattern may be formed on the first conductive film 211 prior to formation of the second conductive film 212, and the second conductive film 212 can be formed by, e.g., electroplating.

Figure 5C:
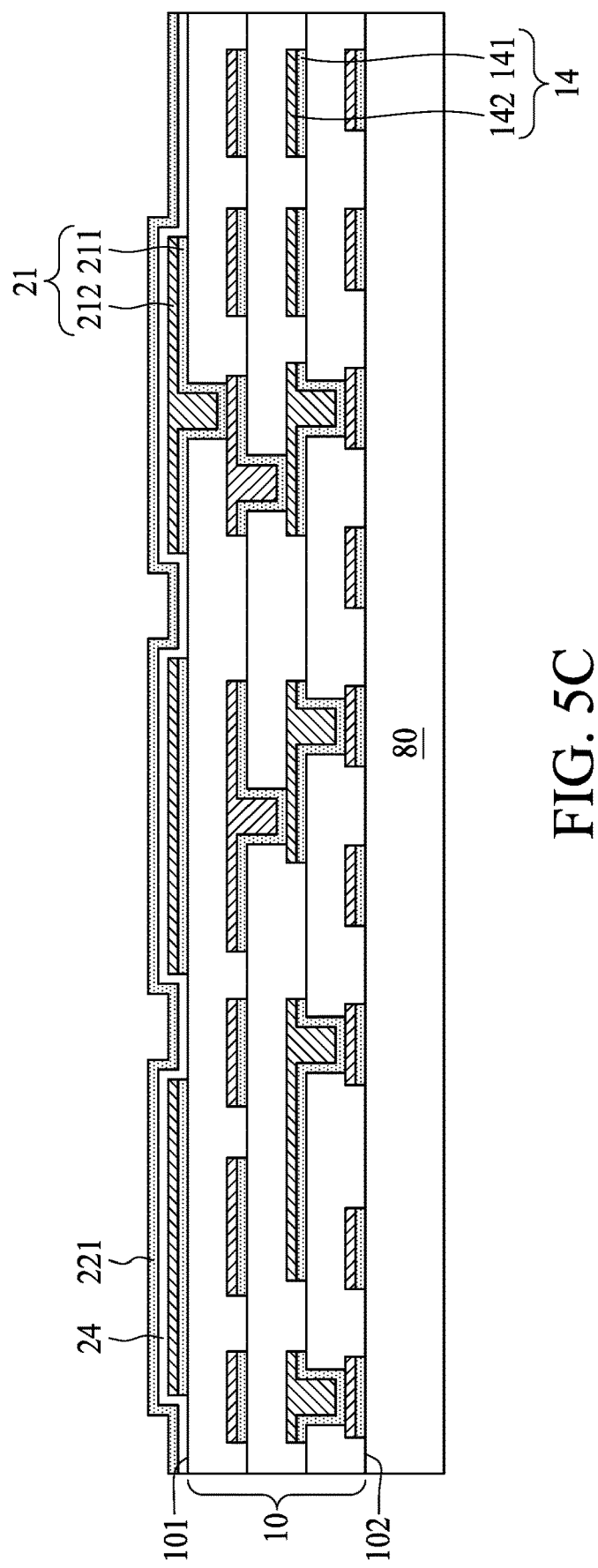

As shown in FIG. 5C, the masking pattern 82 is removed. The first conductive film 211 exposed from the second conductive film 212 is removed by, e.g., etching to form a first patch 21 and a fourth patch 51. A first dielectric layer 24 and another first conductive film 221 are formed on the first patch 21 and the fourth patch 51.

Figure 5D:
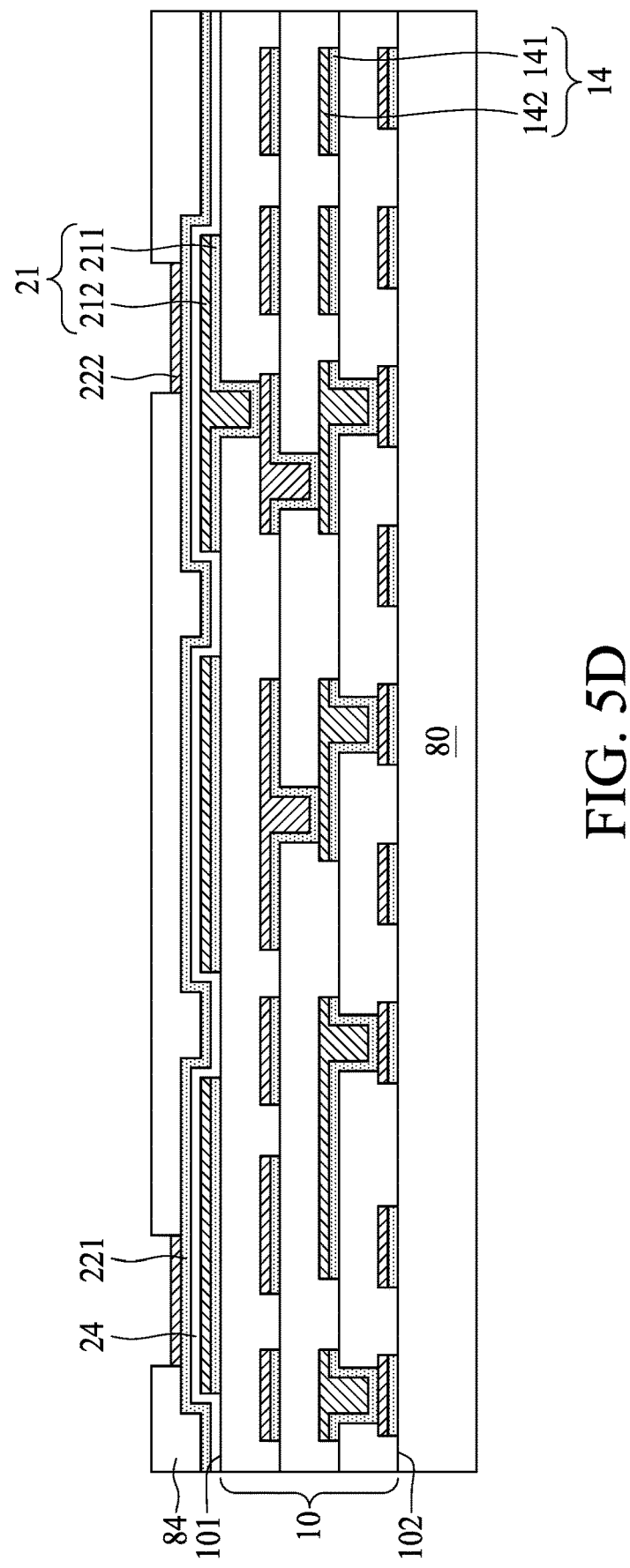

As shown in FIG. 5D, another masking pattern 84 such as a photoresist pattern is formed on the first conductive film 221. Another second conductive film 222 is formed on the first conductive film 221 exposed from the masking pattern 84 is removed by, e.g., electroplating.

Figure 5E:
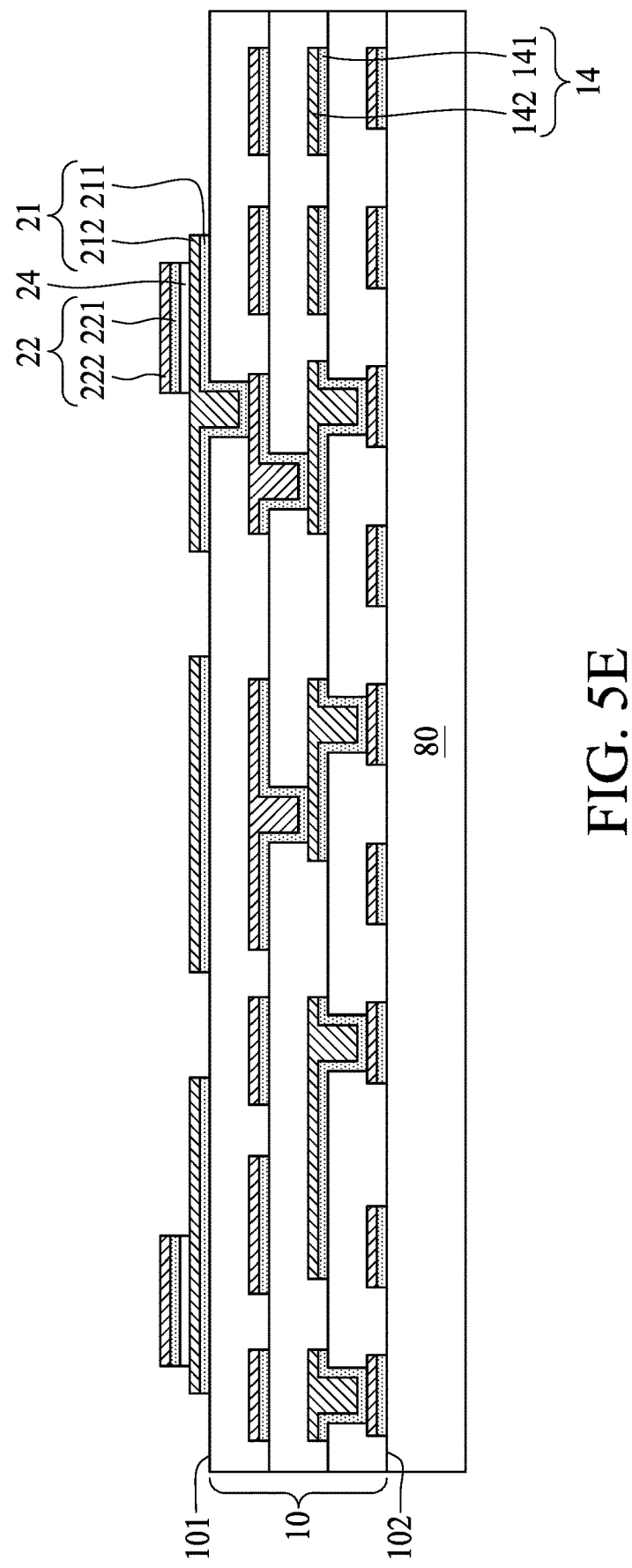

As shown in FIG. 5E, the masking pattern 84 is removed. The first conductive film 221 exposed from the second conductive film 222 is removed by, e.g., etching to form a second patch 22.

Figure 5F:
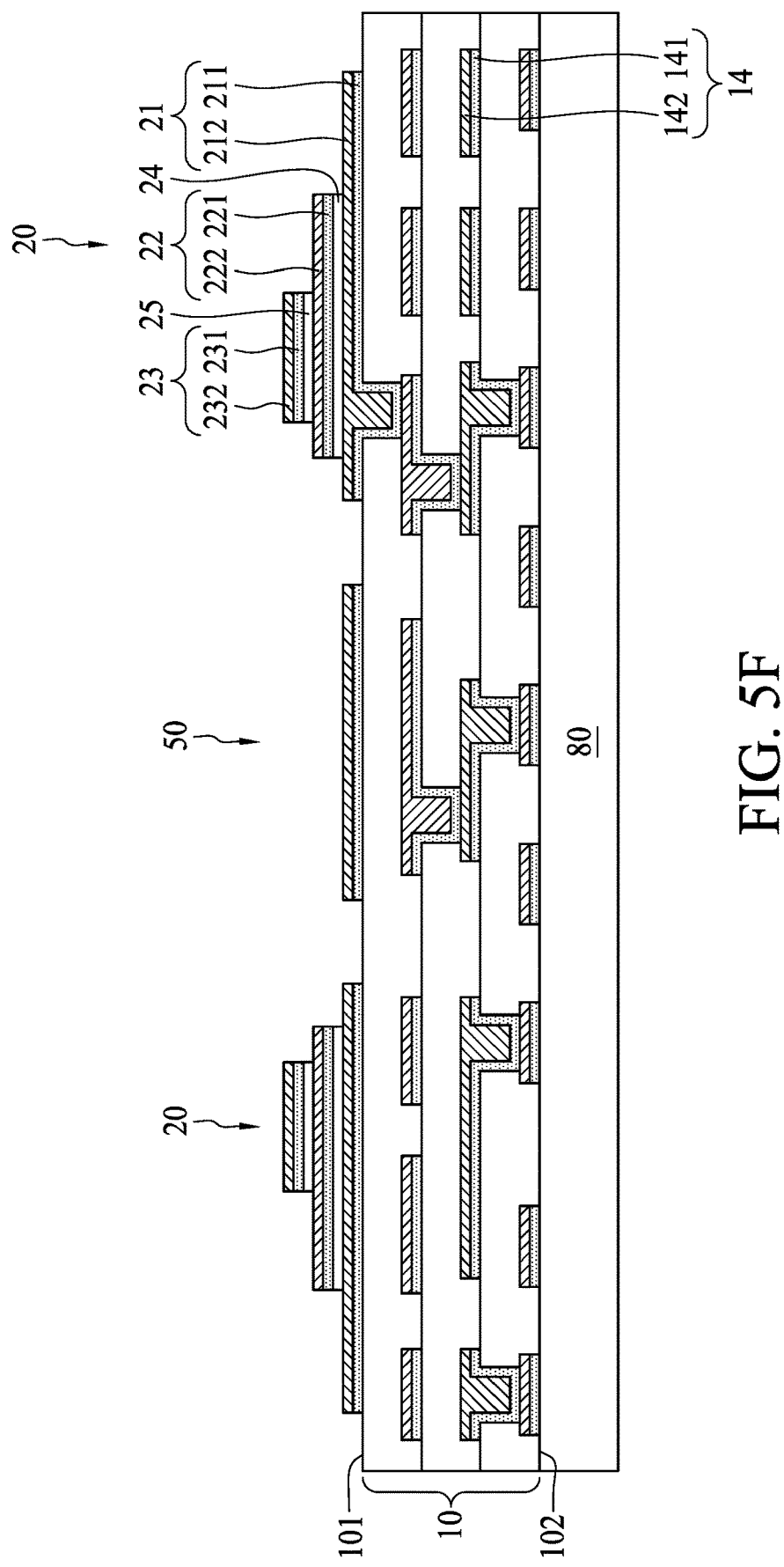

As shown in FIG. 5F, another first conductive film 231 and another second conductive film 232 are formed on the second patch 22 and patterned to form a third patch 23. Accordingly, a first antenna structure 20 and a second antenna structure 50 are formed.

Figure 5G:
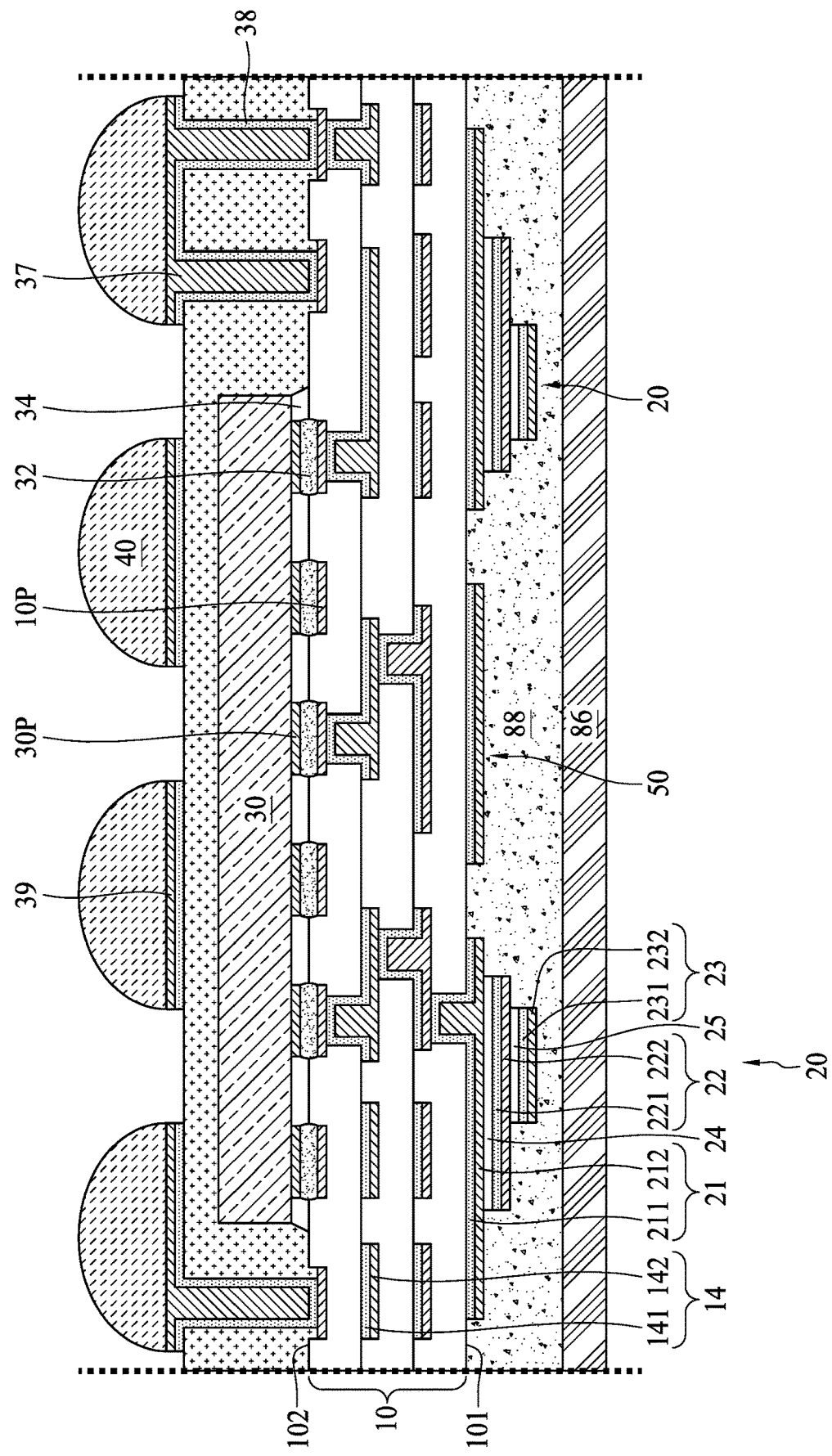

As shown in FIG. 5G, the first antenna structure 20 and the second antenna structure 50 are attached to another carrier 86 with a release layer 88, and the carrier 80 is removed. A semiconductor die 30 is bonded to the circuit layer 10 with conductive structures 32. An underfill 34 is formed between the semiconductor die 30 and the circuit layer 10. An encapsulation layer 36 is formed on the second surface 102 of the circuit layer 10 to encapsulate the semiconductor die 30. In some embodiments, conductive vias 37 such as conductive pillars may be formed in the encapsulation layer 36 to electrically connect the circuit layer 10. In some embodiments, a seed layer 38 may be formed, and the conductive vias 37 may be formed by electroplating. Bonding pads 39 may be formed on the encapsulation layer 36, and electrical conductors such as solder balls 40 may be formed on the bonding pads 39. The circuit layer 10 is then diced to form the semiconductor device package 3 as illustrated in FIG. 3.

Figure 6:
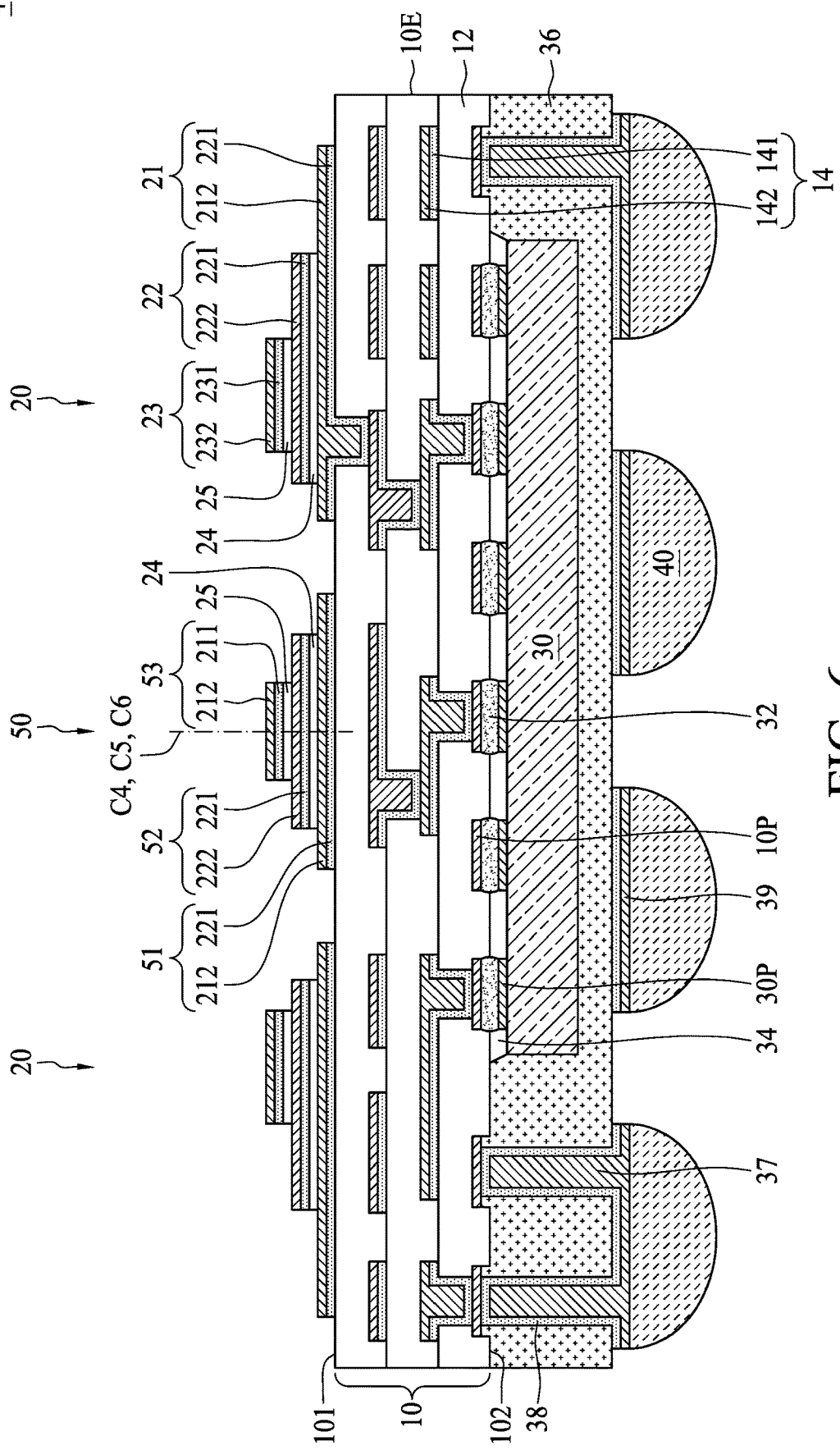
FIG. 6 is a cross-sectional view of a semiconductor device package in accordance with some embodiments of the present disclosure.

FIG. 6 is a cross-sectional view of a semiconductor device package 4 in accordance with some embodiments of the present disclosure. As shown in FIG. 6, in contrast to the semiconductor device package 3 in FIG. 4, the second antenna structure 50 includes a fourth patch 51, a fifth patch 52 and a sixth patch 53 stacked on one another, a first dielectric layer 24 between the fourth patch 51 and the fifth patch 52, and a second dielectric layer 25 between the fifth patch 52 and the sixth patch 53. The edges of the fourth patch 51, the fifth patch 52 and the sixth patch 53 may be misaligned. In some embodiments, the first antenna structure 20 is a substantially asymmetric antenna structure, and the second antenna structure 50 is a substantially symmetric antenna structure disposed on the circuit layer 10 and adjacent to the substantially asymmetric antenna structure. The imaginary central line C5 of the fifth patch 52 is aligned with the imaginary central line C4 of the fourth patch 51, and the imaginary central line C6 of the sixth patch 53 is aligned with the imaginary central lineC5 of the fifth patch 52. The first patch 21 and the fourth patch 51 may be integrally formed. The second patch 22 and the fifth patch 52 may be integrally formed. The third patch 23 and the sixth patch 53 may be integrally formed. The first dielectric layer 24 and the second dielectric layer 25 of the first antenna structure 20 and the second antenna structure 50 may be integrally formed. In some other embodiments, the first dielectric layer 24 and the second dielectric layer 25 of the first antenna structure 20 and the second antenna structure 50 may be individually formed, and the dielectric constants of the first dielectric layer 24 and the second dielectric layer 25 of the first antenna structure 20 may be different from that of the first dielectric layer 24 and the second dielectric layer 25 of the second antenna structure 50.

In some embodiments, the first dielectric constant of the first dielectric layer 24 and the second dielectric constant of the second dielectric layer 25 are determined by the lengths of the first patch 21, the second patch 22 and the third patch 23 such that the first patch 21, the second patch 22 and the third patch 23 of the first antenna structure are responsive to the same frequency band. In some embodiments, the first dielectric constant of the first dielectric layer 24 and the second dielectric constant of the second dielectric layer 25 may be determined by the lengths of the fourth patch 51, the fifth patch 52 and the sixth patch 53 such that the fourth patch 51, the fifth patch 52 and the sixth patch 53 of the second antenna structure are responsive to the same frequency band.

Figure 7:
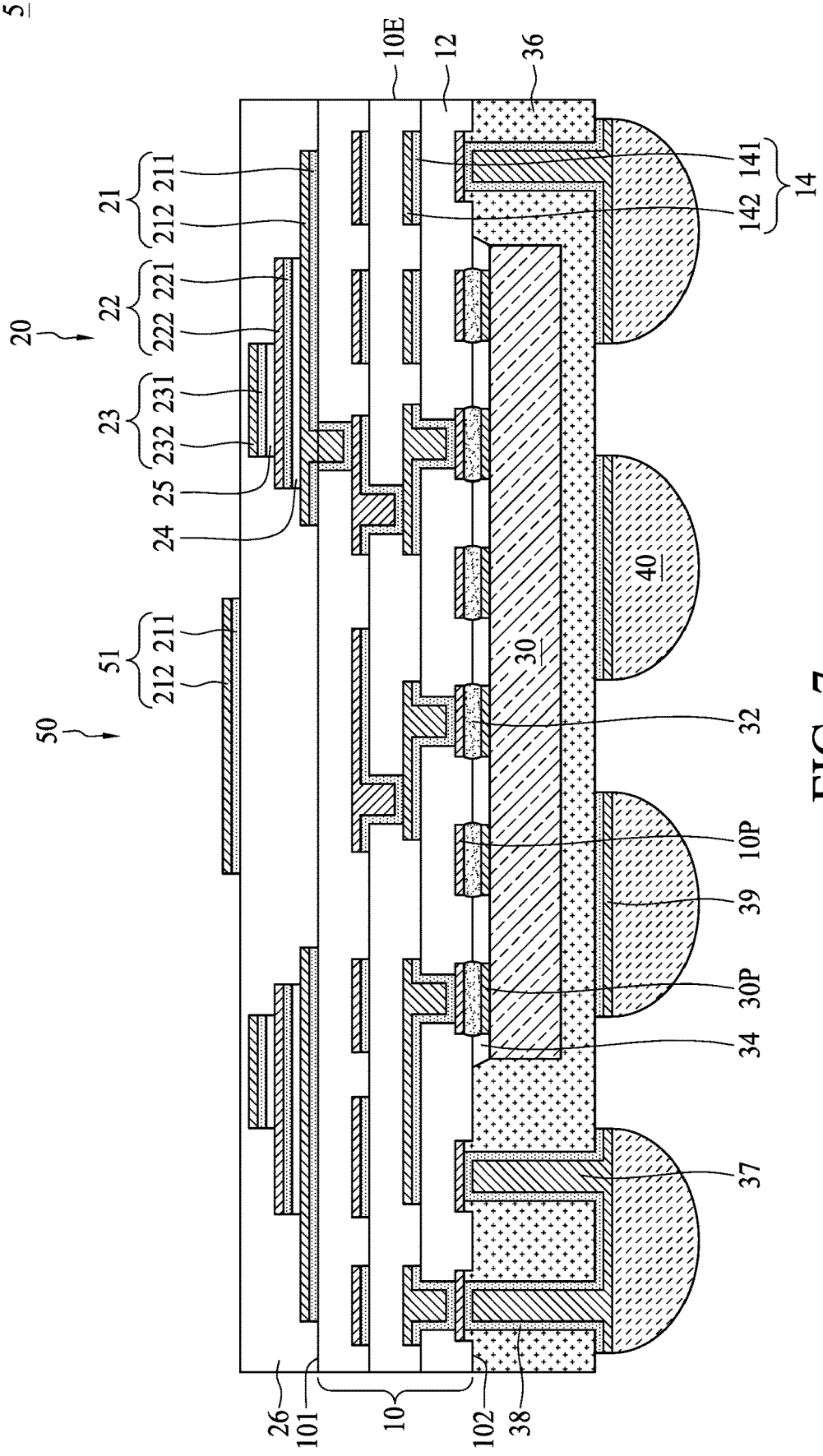
FIG. 7 is a cross-sectional view of a semiconductor device package in accordance with some embodiments of the present disclosure.

FIG. 7 is a cross-sectional view of a semiconductor device package 5 in accordance with some embodiments of the present disclosure. As shown in FIG. 7, in contrast to the semiconductor device package 3 in FIG. 4, the first antenna structure 20 is a substantially asymmetric antenna structure, the second antenna structure 50 is a substantially symmetric antenna structure, and the substantially asymmetric antenna structure and the substantially symmetric antenna structure are disposed at different levels on the circuit layer 10. In some embodiments, a third dielectric layer 26 may be disposed on the first surface 101 of the circuit layer 10 to cover the first antenna structure 20. The second antenna structure 50 may be disposed on, adjacent to or at least partially embedded in the third dielectric layer 26.

Figure 8:
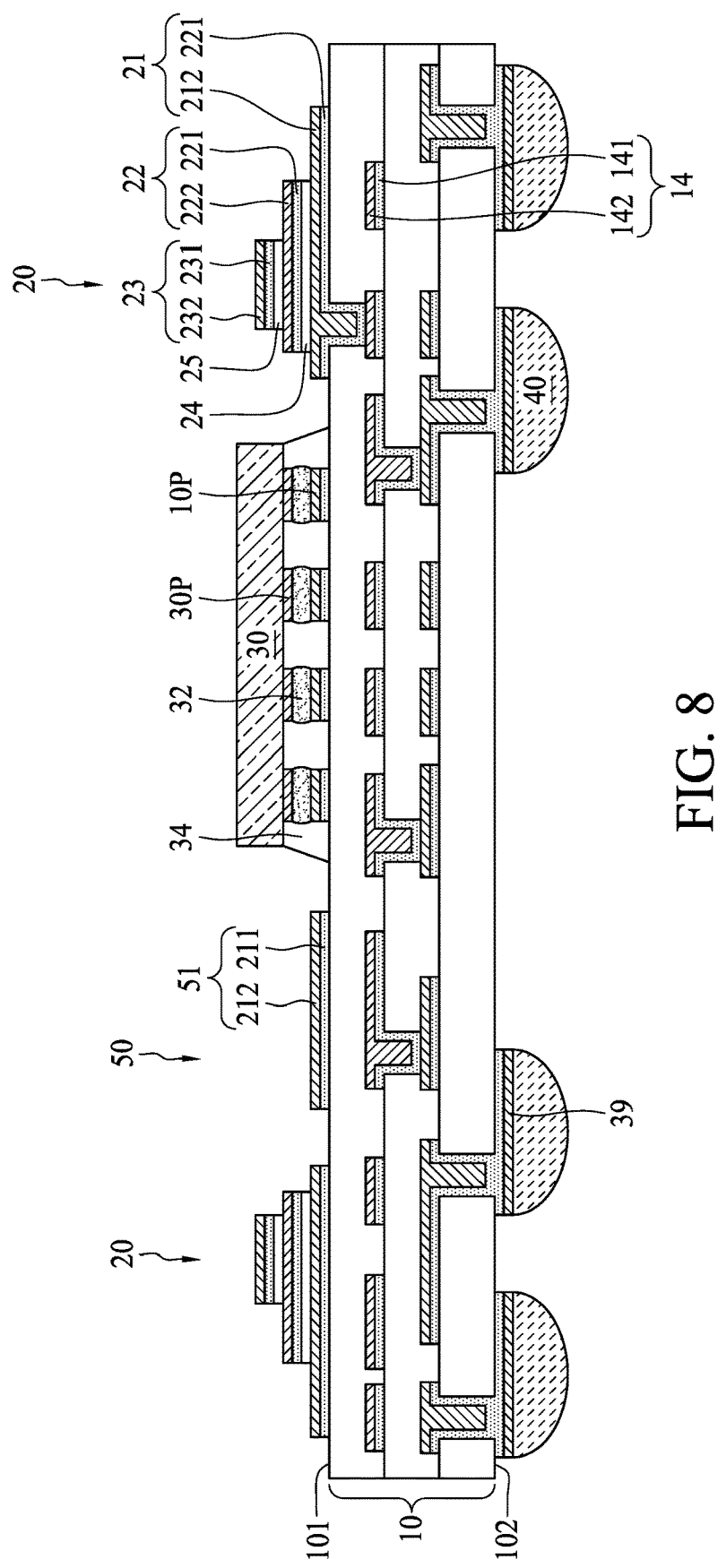
FIG. 8 is a cross-sectional view of a semiconductor device package in accordance with some embodiments of the present disclosure.

FIG. 8 is a cross-sectional view of a semiconductor device package 6 in accordance with some embodiments of the present disclosure. As shown in FIG. 8, in contrast to the semiconductor device package 3 in FIG. 4, the semiconductor die 30 may be disposed on the first surface 101 of the circuit layer 10, and electrically connected to the circuit layer 10.

In some embodiments of the present disclosure, the semiconductor device package uses a stacked patch antenna to increase signal intensity and coverage in normal direction and non-normal direction. The stacked patch antenna includes multiple patches and multiple dielectric layers interposed between the patches. The lengths of the patches vary in a gradient manner, and the dielectric constants of the dielectric layers are selected to match the lengths of the patches such that the multiple patches of the stacked patch antenna may be responsive to signals of the same frequency in normal direction and non-normal direction.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. A semiconductor device package, comprising:
   a circuit layer;
   a substantially asymmetric antenna structure disposed on and electrically connected to the circuit layer, wherein the substantially asymmetric antenna structure comprises a step structure including a first patch, a second patch and a third patch stacked on one another, and edges of the first patch, the second patch and the third patch are misaligned;
   a first dielectric layer between the first patch and the second patch; and
   a second dielectric layer between the second patch and the third patch, wherein a first dielectric constant of the first dielectric layer and a second dielectric constant of the second dielectric layer are different and determined by lengths of the first patch, the second patch and the third patch such that the first patch, the second patch and the third patch of the substantially asymmetric antenna structure are responsive to a same frequency band.

2. The semiconductor device package of claim 1, wherein an imaginary central line of the second patch is misaligned with an imaginary central line of the first patch, and an imaginary central line of the third patch is misaligned with the imaginary central line of the second patch.

3. The semiconductor device package of claim 1, further comprising a substantially symmetric antenna structure disposed on the circuit layer and adjacent to the substantially asymmetric antenna structure.

4. The semiconductor device package of claim 3, wherein the substantially symmetric antenna structure comprises a step structure including a fourth patch, a fifth patch and a sixth patch stacked on one another, and edges of the fourth patch, the fifth patch and the sixth patch are misaligned.

5. The semiconductor device package of claim 4, wherein an imaginary central line of the fifth patch is aligned with an imaginary central line of the fourth patch, and an imaginary central line of the sixth patch is aligned with the imaginary central line of the fifth patch.

6. The semiconductor device package of claim 3, wherein the substantially asymmetric antenna structure and the substantially symmetric antenna structure are disposed at different levels on the circuit layer.

\* \* \* \* \*